United States Patent
Campbell

(10) Patent No.: US 8,001,504 B1
(45) Date of Patent: Aug. 16, 2011

(54) DETERMINING CLOCK SKEW BETWEEN NODES OF AN INTEGRATED CIRCUIT

(75) Inventor: Scott J. Campbell, Fredrick, CO (US)

(73) Assignee: Xilinx, Inc., San Jose, CA (US)

( * ) Notice: Subject to any disclaimer, the term of this patent is extended or adjusted under 35 U.S.C. 154(b) by 581 days.

(21) Appl. No.: 12/181,350

(22) Filed: Jul. 29, 2008

(51) Int. Cl.
*G06F 17/50* (2006.01)

(52) U.S. Cl. ......... 716/106; 716/108; 716/113; 716/134

(58) Field of Classification Search .................. 716/104, 716/106–108, 110–115, 134
See application file for complete search history.

(56) References Cited

U.S. PATENT DOCUMENTS

| | | | |
|---|---|---|---|
| 7,472,365 B1 | 12/2008 | Manaker | |
| 7,475,297 B1 | 1/2009 | Manaker | |
| 2007/0016884 A1* | 1/2007 | Nishimaru | 716/113 |

OTHER PUBLICATIONS

Xilinx, Inc.; U.S. Appl. No. 10/997,565, by Manaker Jr.; filed on Nov. 24, 2004.
Xilinx, Inc.; U.S. Appl. No. 10/997,621, by Manaker Jr.; filed on Nov. 24, 2004.

* cited by examiner

*Primary Examiner* — Paul Dinh
(74) *Attorney, Agent, or Firm* — LeRoy D. Maunu; Lois D. Cartier

(57) ABSTRACT

A set of respective first delay values for paths from a clock source to nodes of the integrated circuit is generated. Respective second delay values for the paths are generated from the clock source through the clock tree to the nodes. Each first delay value corresponds to one of the second delay values for one of the nodes, and each is greater than the corresponding second delay value. A set of common delay values is generated, with each common delay value being a delay for a shared portion of the paths from the clock source through the clock tree to two of the nodes. The determined clock skew is based on the first delay value for a first node, the second delay value for a second node, and the common delay value for the shared portion of the paths from the clock source to the first and second nodes.

20 Claims, 7 Drawing Sheets

DETERMINING CLOCK SKEW BETWEEN NODES OF AN INTEGRATED CIRCUIT

FIELD OF THE INVENTION

The present invention generally relates to determining a clock skew between nodes of an integrated circuit.

BACKGROUND

As the geometries of VLSI circuits continue to decrease, the corresponding delays of the CMOS gates in these devices also decrease. The resistance of a routing wire increases as the width of the wire decreases, thus the routing delays decrease at a slower rate than logic delays as geometries shrink, which causes the ratio of routing delay to logic delay to increase with each device generation. Therefore, there is a need for a more accurate clock skew analysis methodology to ensure maximum frequency operation of an electronic circuit design. While designers attempt to make the delays uniform across clock network resources, static and dynamic component delay variations can occur due to process, voltage and temperature differences across the integrated circuit (IC). In order to provide for more accurate clock skew analysis in view of these variations, clock skew analysis often uses both the maximum and minimum delay values. While methods have been explored to increase the accuracy of clock skew calculations, these methods may be time and resource intensive or produce results that are biased toward worst-case clock skews.

The present invention may address one or more of the above issues.

SUMMARY

The present invention provides various approaches for determining a clock skew between first and second nodes of a plurality of nodes of an integrated circuit. In one embodiment, the method comprises generating and storing a set of respective first delay values for paths from a clock source through a clock tree of the integrated circuit to the plurality of nodes. A set of respective second delay values for the paths is generated from the clock source through the clock tree to the plurality of nodes, and the set is thereafter stored. Each of the first delay values corresponds to one of the second delay values for a given one of the plurality of nodes, and each of the first delay values is greater than the corresponding one of the second delay values. A set of common delay values is generated and stored, with each of the common delay values being a delay for a shared portion of the paths from the clock source through the clock tree to two of the plurality of nodes. The method determines the clock skew based on the first delay value for the first node, the second delay value for the second node, and the common delay value for the shared portion of the paths from the clock source through the clock tree to the first and second nodes. The method then outputs data indicative of the clock skew.

Another embodiment provides a processor-implemented method of determining a clock skew between a source register and a destination register in a plurality of registers of the integrated circuit. The method comprises generating and storing a set of first delay values for paths from a clock source through a clock tree of the integrated circuit to each of the plurality of registers. A set of second delay values for the paths from the clock source through the clock tree to each of the plurality of registers is generated and stored. Each of the first delay values corresponds to one of the second delay values for a given one of the plurality of registers, and each of the first delay values is longer than the corresponding one of the second delay values. The method further includes generating and storing a set of common delay values, with each of the common delay values being a delay for a shared portion of the paths from the clock source through the clock tree to two of the plurality of registers. An estimate of the clock skew is determined as being a difference between the first delay value for the source register and the second delay value for the destination register, and the clock skew is determined as the difference between the estimate and the common delay value for the shared portion of the paths from the clock source through the clock tree to the source and destination registers. The method outputs data indicative of the clock skew.

In another embodiment, a program storage medium comprises a processor-readable storage device configured with instructions for determining clock skew. The execution of the instructions by one or more processors causes the one or more processors to perform operations including generating and storing a set of respective first delay values for paths from a clock source through a clock tree of the integrated circuit to the plurality of nodes. The operations further include generating and storing a set of respective second delay values for the paths from the clock source through the clock tree to the plurality of nodes. Each of the first delay values corresponds to one of the second delay values for a given one of the plurality of nodes, and each of the first delay values is greater than the corresponding one of the second delay values. A set of common delay values is generated and stored, with each of the common delay values being a delay for a shared portion of the paths from the clock source through the clock tree to two of the plurality of nodes. The operations further include outputting data indicative of the clock skew based on the first delay value for the first node, the second delay value for the second node, and the common delay value for the shared portion of the paths from the clock source through the clock tree to the first and second nodes.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION OF THE DRAWINGS

The various embodiments of the invention recognize that where two nodes share a portion of a clock path, that shared portion of the clock path does not affect the clock skew for those two nodes. Thus, in calculating the clock skew for two nodes in a design, the shared portion of the clock paths from a clock source to the nodes is removed as a factor. Other embodiments recognize that for some ICs, for example, those having programmable logic, the clock network is fixed and the clock delay to any node on that clock network is also fixed. The fixed nature of the clock network allows preprocessing of the network to store maximum and minimum delay values for the nodes in the clock network. Also, the buffers for the nodes are stored for purposes of determining the common portion of the clock path between two nodes. The various approaches described below provide an accurate view of the clock skew between nodes of a design and do so using static analysis and without unduly impacting computational complexity storage requirements.

Figure 1:
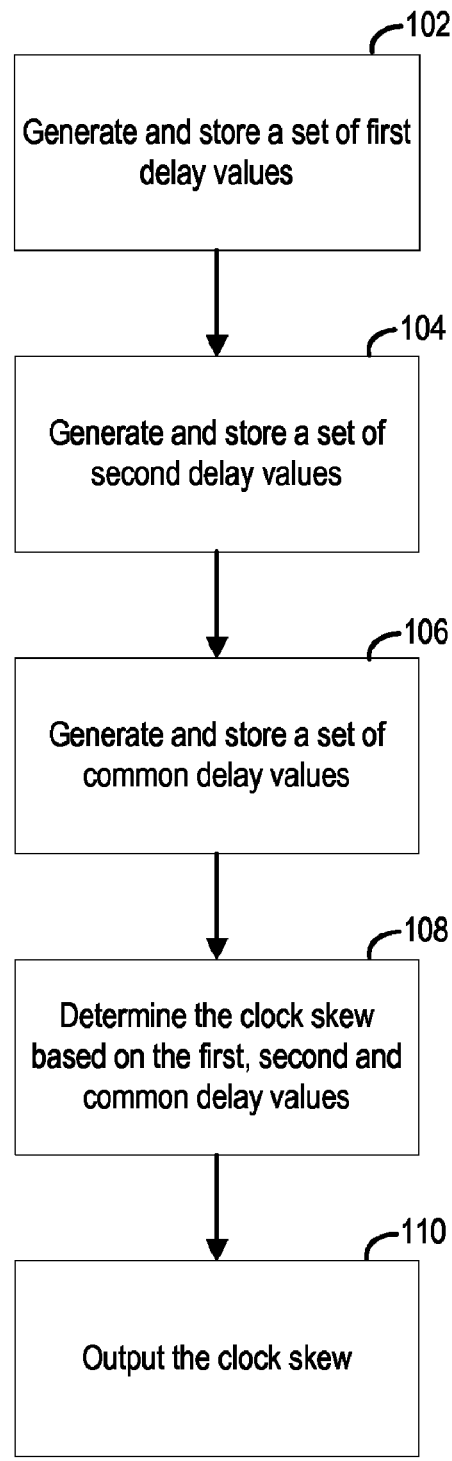
FIG. 1 illustrates a flow diagram of determining clock skew between a plurality of nodes of an integrated circuit according to an example embodiment of the present invention.

FIG. 1 illustrates a flow diagram for determining clock skew between a plurality of nodes of an integrated circuit according to example embodiments of the present invention. The process generally entails storing maximum and minimum delay values relative to a clock source for nodes in a clock network, along with common delay values for shared portions of clock paths for pairs of nodes. The pre-storing of the delay values permits efficient and accurate static analysis of clock skew.

A set of respective first delay values for paths from a clock source through the clock tree of the integrated circuit to the plurality of nodes is generated and stored in step 102. A set of respective second delay values for the paths from the clock source through the clock tree to the plurality of nodes is generated and stored in step 104. Each of the first delay values corresponds to one of the second delay values for a given one of the nodes, with each of the first delay values being greater than the corresponding one of the second delay values. In one implementation, each of the first delay values represents the maximum delay time for a clock signal to propagate from the clock source through the clock tree to one of the nodes, and each of the second delay values represents the minimum delay time for the clock signal to propagate from the clock source through the clock tree to one of the nodes.

A set of common delay values is generated and stored in step 106. Each of the common delay values is a delay for a shared portion of the paths from the clock source through the clock tree to two of the nodes. Each pair of nodes has an associated common delay value. The clock skew is determined based on the first delay value for the first node, the second delay value for the second node, and the common delay value for the shared portion of the paths from the clock source through the clock tree to the first and second nodes in step 108. The clock skew is output in step 110.

In one implementation, the clock skew is a setup time clock skew, with the first node being designated as the source node and the second node being designated as the destination node. In this instance, the first delay value for the first node is the maximum delay time for a clock signal to propagate from the clock source through the clock tree to the source node, and the second delay value for the second node is the minimum delay time for the clock signal to propagate from the clock source through the clock tree to the destination node.

In another implementation, the clock skew is a hold time clock skew, with the first node being designated as the destination node and the second node being designated as the source node. In this instance, the first delay value for the first node is the maximum delay time for a clock signal to propagate from the clock source through the clock tree to the destination node, and the second delay value for the second node is the minimum delay time for the clock signal to propagate from the clock source through the clock tree to the source node.

Figure 2A:
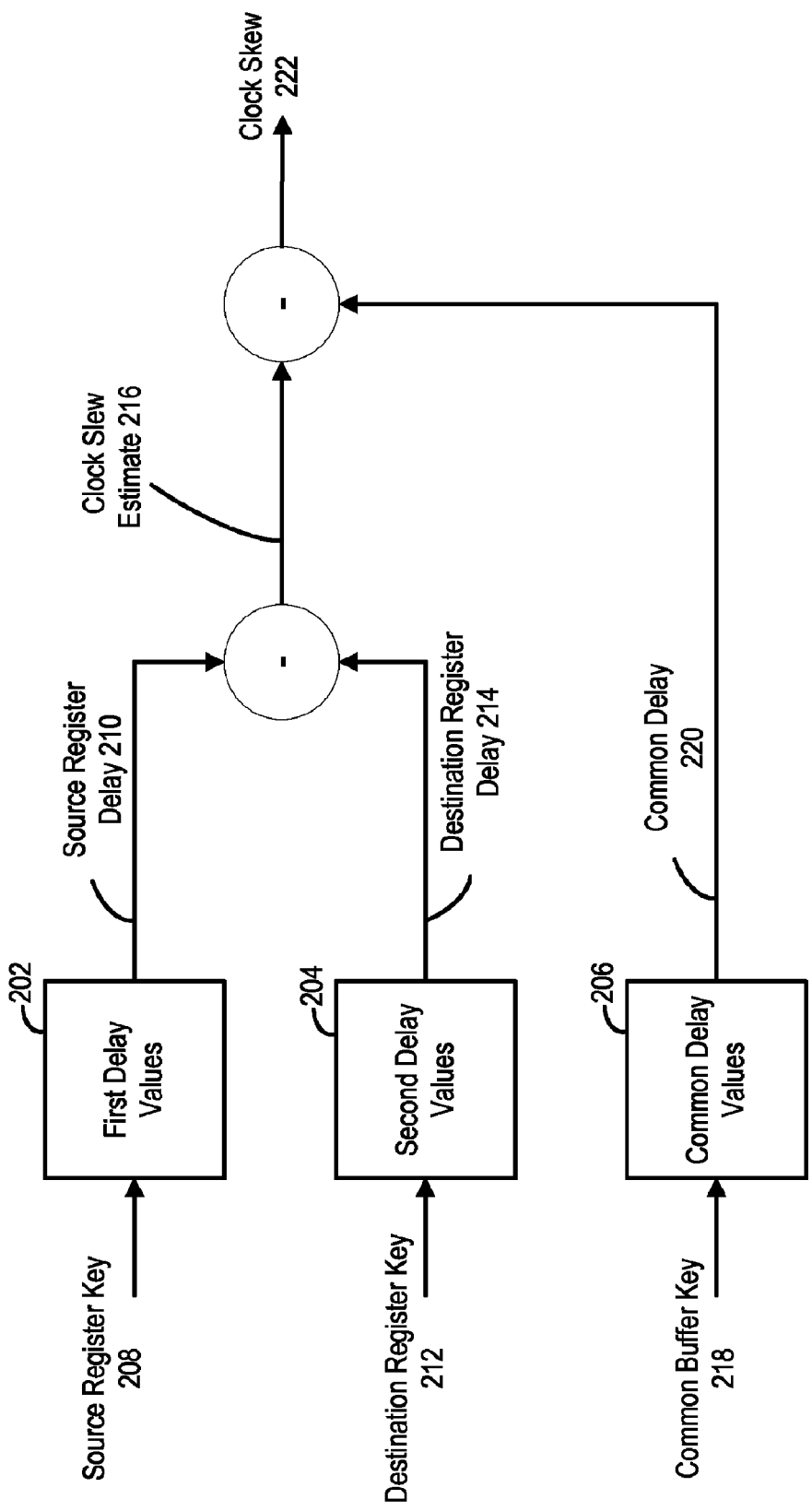
FIG. 2A is a block diagram that illustrates determining clock skew between registers of an integrated circuit according to an example embodiment of the present invention.

FIG. 2A is a block diagram that illustrates determining clock skew between registers of an integrated circuit according to an example embodiment of the present invention. The registers correspond to the nodes discussed above in reference to FIG. 1. The example embodiment illustrates determining the clock skew for an example IC, such as a field programmable gate array (FPGA). In FPGAs, the global clock tree is a fixed network of buffers and routing segments. A clock signal travels on paths from the clock source through the buffers to each of the registers. The paths that the clock signal travels through the clock tree to any two of the registers have common portions and common buffers. The clock network is fixed, thus, the clock delay to any register on the network is also fixed. In addition, the clock skew between two registers is fixed because the delay to the registers is fixed. The fixed nature of the clock network allows the preprocessing of the network to determine the clock skew between any of the registers.

A set of first delay values 202 for the registers is generated and stored. Each first delay value represents the maximum time period for the clock signal to propagate from the clock source through the clock tree to one of the registers. A set of second delay values 204 for the registers is also generated and stored. Each second delay value represents the minimum time period for the clock signal to propagate from the clock source through the clock tree to one of the registers. Thus, each register has a first delay value in block 202 and a corresponding second delay value in block 204.

A set of common delay values 206 is generated and stored. Each common delay value represents the time period for the clock signal to propagate from the clock source though the clock tree to the last common point between the clock source and two of the registers. Each common delay value is calculated by subtracting the minimum time period for the clock signal to propagate from the clock source through the clock tree to a respective one of the common points from the maximum time period for the clock signal to propagate from the clock source through the clock tree to the respective one of the common points. In one implementation, the first delay values 202, the second delay values 204 and the common delay values 206 are stored in respective tables, which are accessed by input keys 208, 212, and 218 as explained further below.

In determining the clock skew between two registers, one is designated as the source register and the other is designated as the destination register. The first delay values 202, the second delay values 204 and the common delay values 206 are used to determine the clock skew between the source register and the destination register. The source register is identified by a source register key 208, which is used to look up the source register delay 210 in the first delay values (i.e., to look up the maximum delay for the source register). The destination register is identified by a destination register key 212, which is used to look up the destination register delay 214 in the second delay values 204 (i.e., to look up the minimum delay for the destination register). The destination register delay 214 is subtracted from source register delay 210 to determine clock skew estimate 216.

The clock skew estimate 216 includes clock skew along the common portion of the path from the clock source through the clock tree to the source and destination registers. The common portion of the path will not have clock skew during operation. Thus, the clock skew for the common portion is removed from the clock skew estimate 216 as follows. The last common buffer is the nearest clock buffer that drives both the source and destination registers. The clock path from the clock source to the last common buffer is identical for both the source and destination registers. The last common buffer is identified by a common buffer key 218, which is used to look up common delay 220 in the common delay values 206. The common delay 220 is subtracted from clock skew estimate 216 to determine the clock skew 222 between the source and destination registers.

Figure 2B:
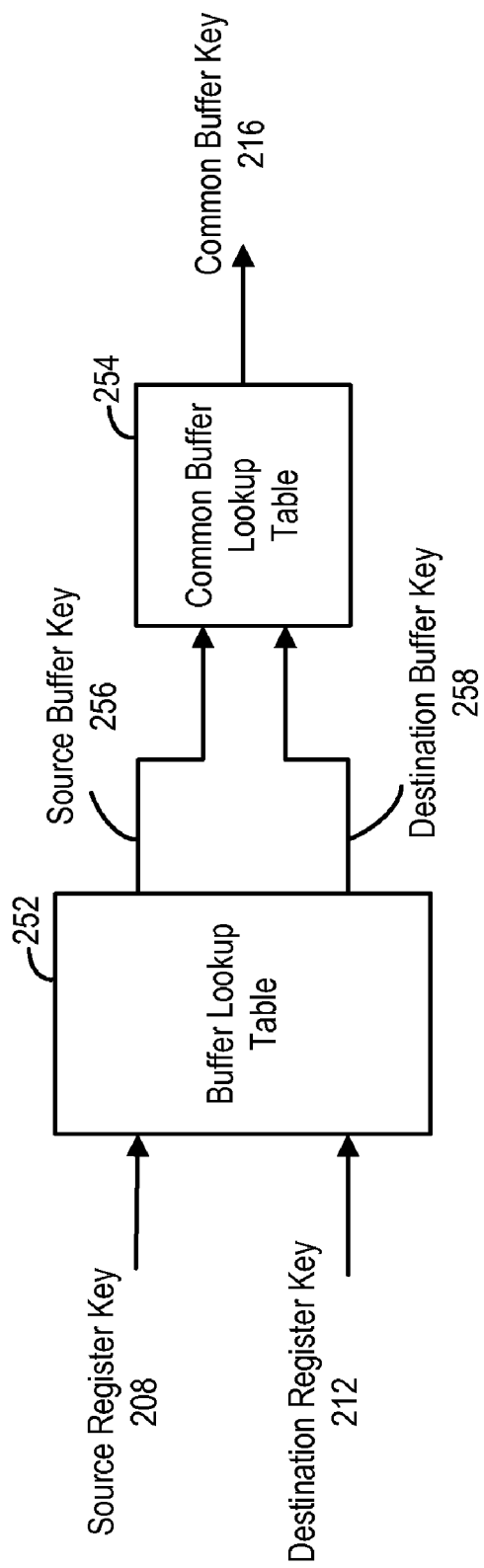
FIG. 2B is a block diagram that shows determining the common buffer key for the last common buffer between the clock source and the source and destination registers according to an example embodiment of the present invention.

FIG. 2B is a block diagram that shows determining the common buffer key 216 for the last common buffer between the clock source and the source and destination registers according to an example embodiment of the present invention. A buffer lookup table 252 is created by preprocessing (prior to static analysis) the clock network and locating the clock buffer that drives each register on the network. The buffer lookup table 252 contains, for each register, a buffer key that identifies the last buffer that drives that register between the clock source and that register. As discussed above, the last common buffer between the clock source and the source and destination registers is the nearest clock buffer that drives both registers. A common buffer lookup table 254 is created by preprocessing the clock network to determine the common buffer between every buffer pair in the clock network. The common buffer lookup table contains for each pair of registers, a key that identifies the last common buffer for that pair of registers. The source register key 208 and the destination register key 212 are used to respectively look up the source buffer key 256 and the destination buffer key 258 in the buffer lookup table 252. The source buffer key 256 and the destination buffer key 258 are then used to look up the common buffer key 216 in the common buffer lookup table 254.

Figure 3A:
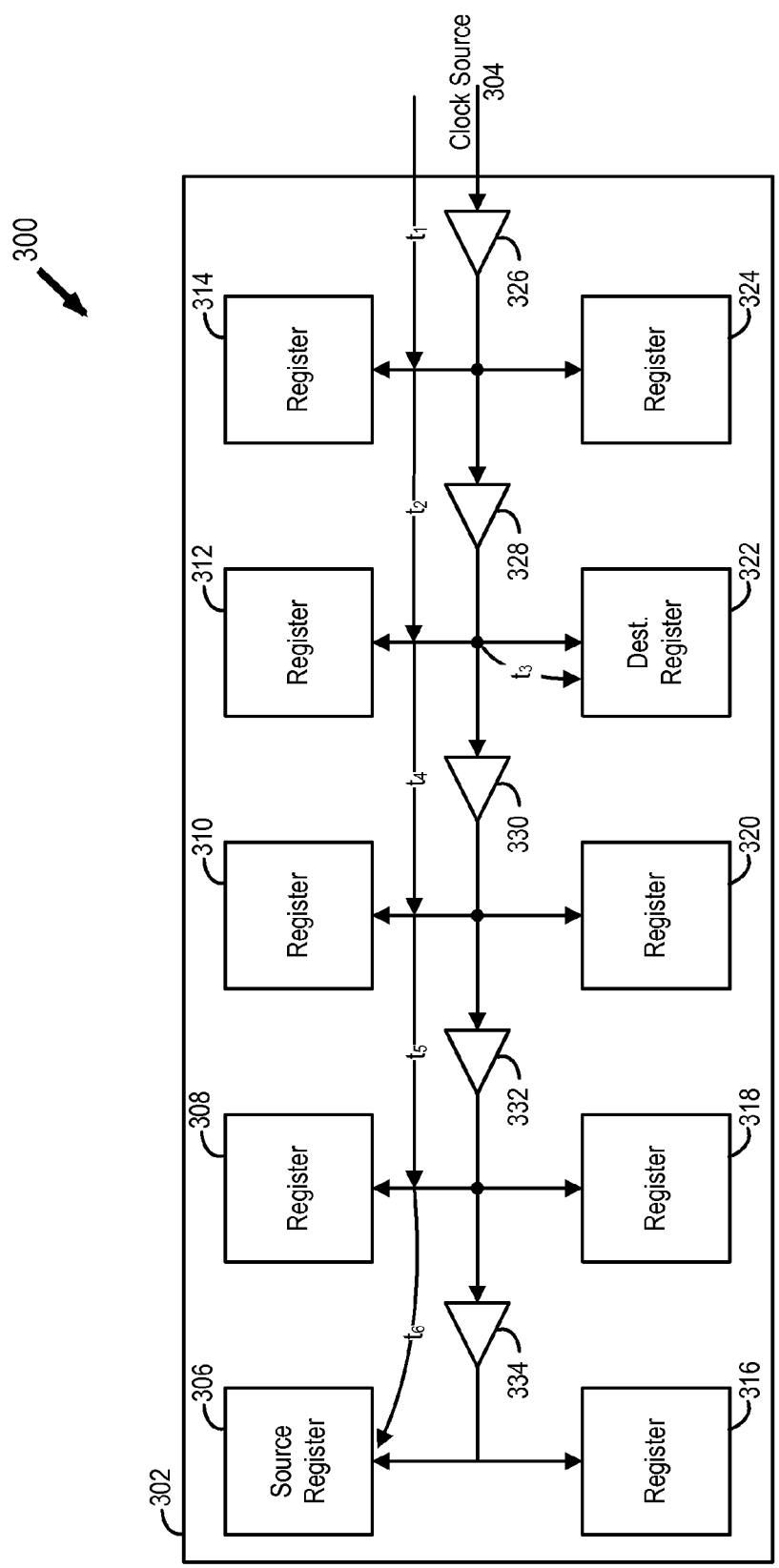
FIGS. 3A and 3B are block diagrams of networks that include portions of example clock trees used to show how delays in clock trees are determined according to example embodiments of the present invention.
Figure 3B:
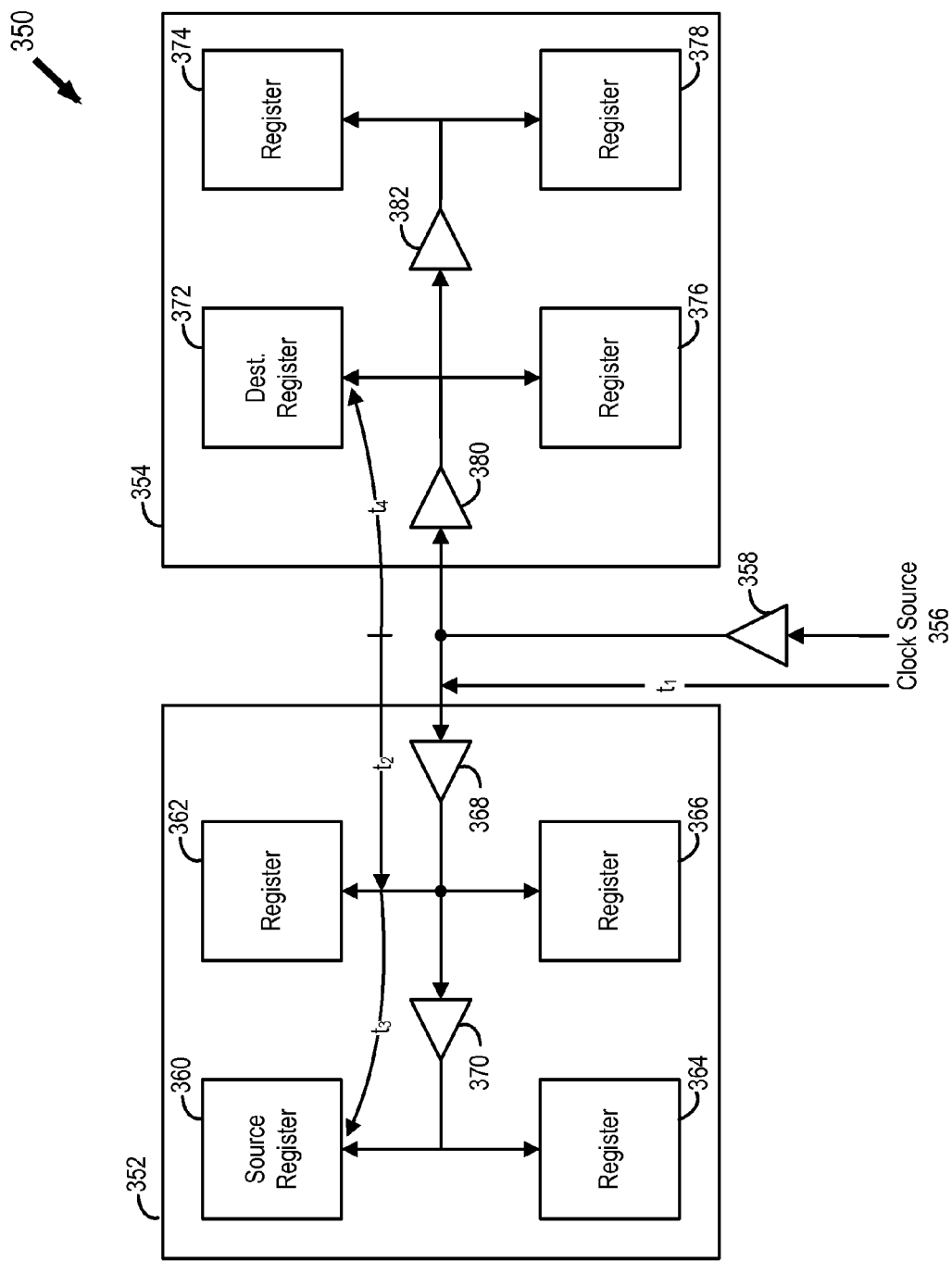

FIGS. 3A and 3B are block diagrams of networks that include portions of example clock trees used to show how delays in clock trees are determined according to example embodiments of the present invention. In a comb network, the clock tree is divided into clock regions which are fed by one common clock tree branch. Clock buffers are placed along the common clock tree branch in sequential order, with the clock buffers closest to the branch source feeding all the buffers that are more distant from the branch source. FIG. 3A shows a network 300 that includes clock region 302 which is fed by clock source 304. The clock region includes registers 306-324 which are fed by clock buffers 326-334.

The structure of the clock tree in clock region 302 results in an ordered list that identifies the last common buffer between the clock source 304 and every two of the registers. By arranging the buffer keys in sequential order from the clock source 304, the common clock buffer for a pair of registers will always have the lowest key between the clock buffers feeding the pair of the registers. For example, when register 306 is the source register (which is sourced by clock buffer 334) and register 322 is the destination register (which is sourced by clock buffer 328), the common clock buffer is clock buffer 328, which is the smallest key of the two clock buffers.

In one implementation, the number of common buffer keys stored in the common buffer lookup table is reduced by representing several physical buffers by a single virtual common buffer. The clock buffer 326 is the first buffer in the chain. The clock buffers 328-334 which feed source register 306 are abstracted away, the clock buffer driving source register 306 is changed from buffer 334 to buffer 326, and the delays $t_2$ and $t_4$-$t_6$ from buffer 326 to source register 306 are added together. The clock buffer 328 feeding destination register 322 is abstracted away, the clock buffer driving destination register 322 is changed from buffer 328 to buffer 326, and the delays $t_2$ and $t_3$ from buffer 326 to destination register 322 are added together. While abstracting several physical clock buffers into one virtual buffer can reduce the size of the common buffer lookup table, it also adds pessimism into the clock skew calculation. The pessimism is added because the clock skew is calculated over a common portion of the paths through the clock network to the source and destination registers. In this instance, the common portion of the path is the delay $t_2$ for buffer 328, and the pessimism added to the clock skew is the difference between the maximum and minimum delays for this common portion. The ideal clock skew is equal to max $(t_6)$+max$(t_5)$+max$(t_4)$−min$(t_3)$, whereas the pessimism adds the difference between max$(t_2)$ and min$(t_2)$ to the ideal clock skew.

The clock regions for comb clock structures are fed from an H tree structure. When the source and destination registers are located in different clock regions, the common buffer is the source buffer of the H tree structure. FIG. 3B shows a network 350 that includes clock regions 352 and 354 which are fed by clock source 356 via clock buffer 358. The clock region 352 includes registers 360-366 and clock buffers 368 and 370, and clock region 354 includes registers 372-378 and clock buffers 380 and 382. The source register 360 and the destination register 372 are in different clock regions, thus the common buffer is source buffer 358, which feeds clock regions 352 and 354.

In one implementation, the buffer lookup table (e.g., 252 of FIG. 2B) is modified to include the clock regions of each of the registers. The structure of the clock tree then allows the common buffer lookup table (e.g., 254 of FIG. 2B) to be replaced with a common buffer algorithm. The source register key is used to look up the clock region of the source register and the clock buffer that drives the source register. The destination register key is used to look up the clock region of the destination register and the clock buffer that drives the destination register. This information is used by the common buffer algorithm to determine the common buffer key. First, the process determines whether or not the source and destination registers are in the same clock region. If the source and destination registers are not in the same clock region, then the common buffer is the source clock buffer of the H tree structure (e.g., buffer 358). If the source and destination registers are in the same clock region, then the common buffer is the smallest key between the clock buffers feeding the source and destination registers (e.g., buffer 322). The replacement of the common buffer lookup table with the common buffer algorithm allows an arbitrarily complex clock buffer representation without increasing the runtime or memory complexity needed for determining the clock skew. In addition, a complex clock network representation allows reduction of the common path clock skew pessimism, thereby increasing the accuracy of the calculated clock skew.

Using the common buffer algorithm with reference to FIG. 3A, the source and destination registers 306 and 322 are located in the same clock regions 302 and the last common buffer is identified as clock buffer 328, which drives destination register 322. The common buffer key for clock buffer 328 is used to look up the common delay for the shared portion of the paths from clock source 304 through the clock tree to the source and destination registers 306 and 322. The previously computed and stored common delay is equal to max$(t_1)$+max $(t_2)$−min$(t_1)$−min$(t_2)$. The previously computed and stored source register delay is equal to max$(t_1)$+max$(t_2)$+max$(t_4)$+max$(t_5)$+max$(t_6)$, and the previously computed and stored destination register delay is equal to min($t_1$)+min($t_2$)+min($t_3$). The destination register delay is subtracted from the source register delay to determine the pessimistic clock skew and the common delay is then subtracted from the pessimistic clock skew to yield the clock skew, which is equal to max($t_4$)+max($t_5$)+max($t_6$)−min($t_3$).

Using the common buffer algorithm with reference to FIG. 3B, the source and destination registers 360 and 372 are located in clock regions 352 and 354, respectively. Thus the last common buffer is identified as source buffer 358, which feeds the clock regions 352 and 354. The common buffer key for source buffer 358 is used to look up the common delay for the shared portion of the paths from clock source 356 through the clock tree to the source and destination registers 360 and 372. The previously computed and stored common delay is equal to max($t_1$)−min($t_1$). The previously computed and stored source register delay is equal to max($t_1$)+max($t_2$)+max($t_3$), and the previously computed and stored destination register delay is equal to min($t_1$)+min($t_4$). The destination register delay is subtracted from the source register delay to determine the pessimistic clock skew and the common delay is then subtracted from the pessimistic clock skew to yield the clock skew, which is equal to max($t_2$)+max($t_3$)−min($t_4$).

Figure 4:
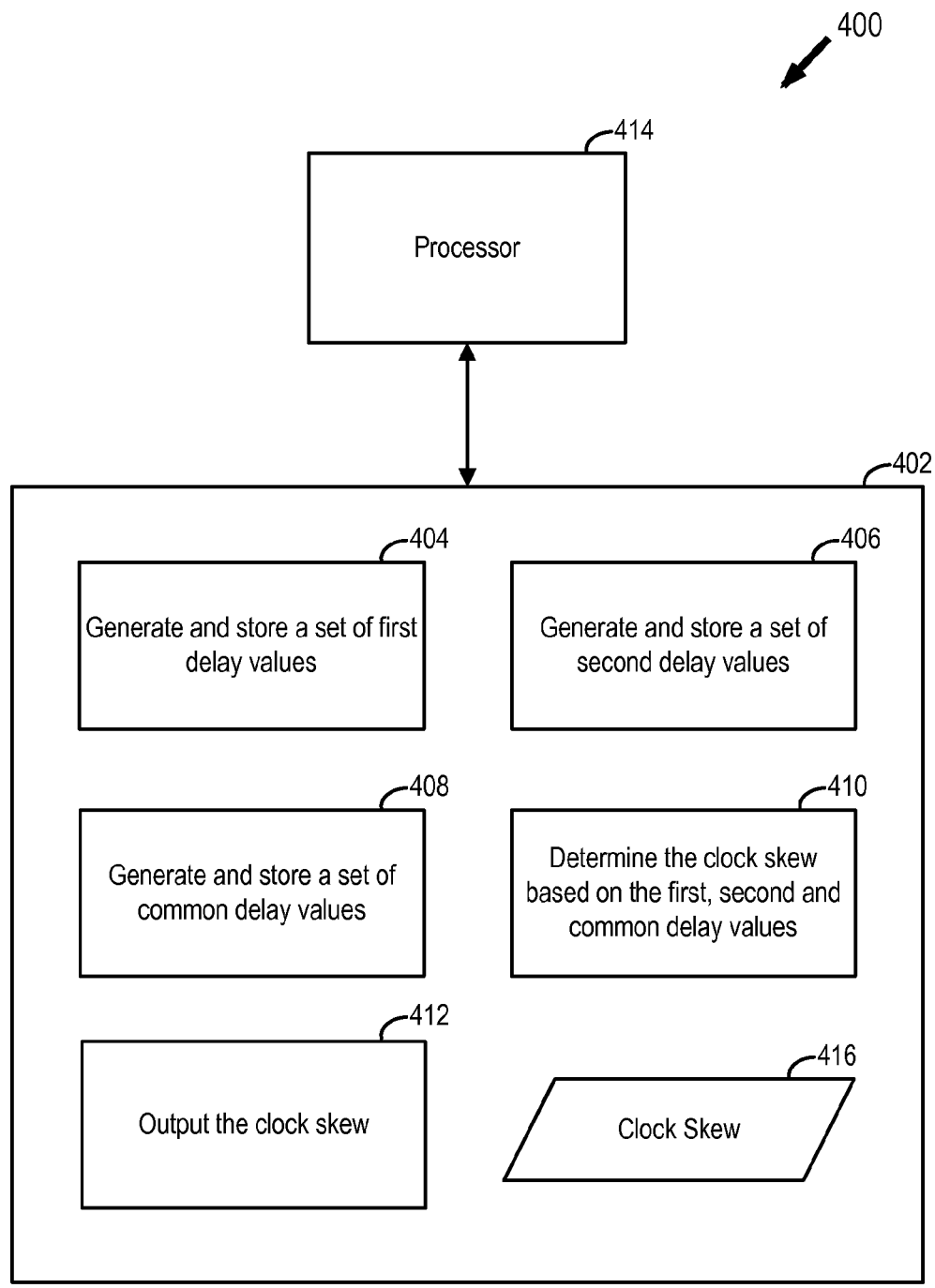
FIG. 4 illustrates a block diagram of a system 400 for determining clock skew between registers of an integrated circuit according to an example embodiment of the present invention.

FIG. 4 illustrates a block diagram of a system 400 for determining clock skew between registers of an integrated circuit according to an example embodiment of the present invention.

Processor-readable device 402 is configured with software modules 404, 406, 408, 410 and 412. Execution of the instructions of software modules 404, 406, 408, 410 and 412 by processor 414 causes processor 414 to determine the clock skew between first and second ones of the registers and to output the clock skew. In one embodiment, the clock skew 416 is stored on the processor readable device 402.

Execution of the instructions of software module 404 causes processor 414 to generate and store a set of first delay values for paths from a clock source through the clock tree of the integrated circuit to each of the registers. Execution of the instructions of software module 406 causes processor 414 to generate and store a set of second delay values for the paths from the clock source through the clock tree to each of the registers. Execution of the instructions of software module 408 causes processor 414 to generate and store a set of common delay values, each of the common delay values being a delay for a shared portion of the paths from the clock source through the clock tree to two of the registers. Execution of the instructions of software module 410 causes processor 414 to determine the clock skew based on the first delay value for the first register, the second delay value for the second register, and the common delay value for the shared portion of the paths from the clock source through the clock tree to the first and second register. Execution of the instructions of software module 412 causes processor 414 to output the clock skew.

Figure 5:
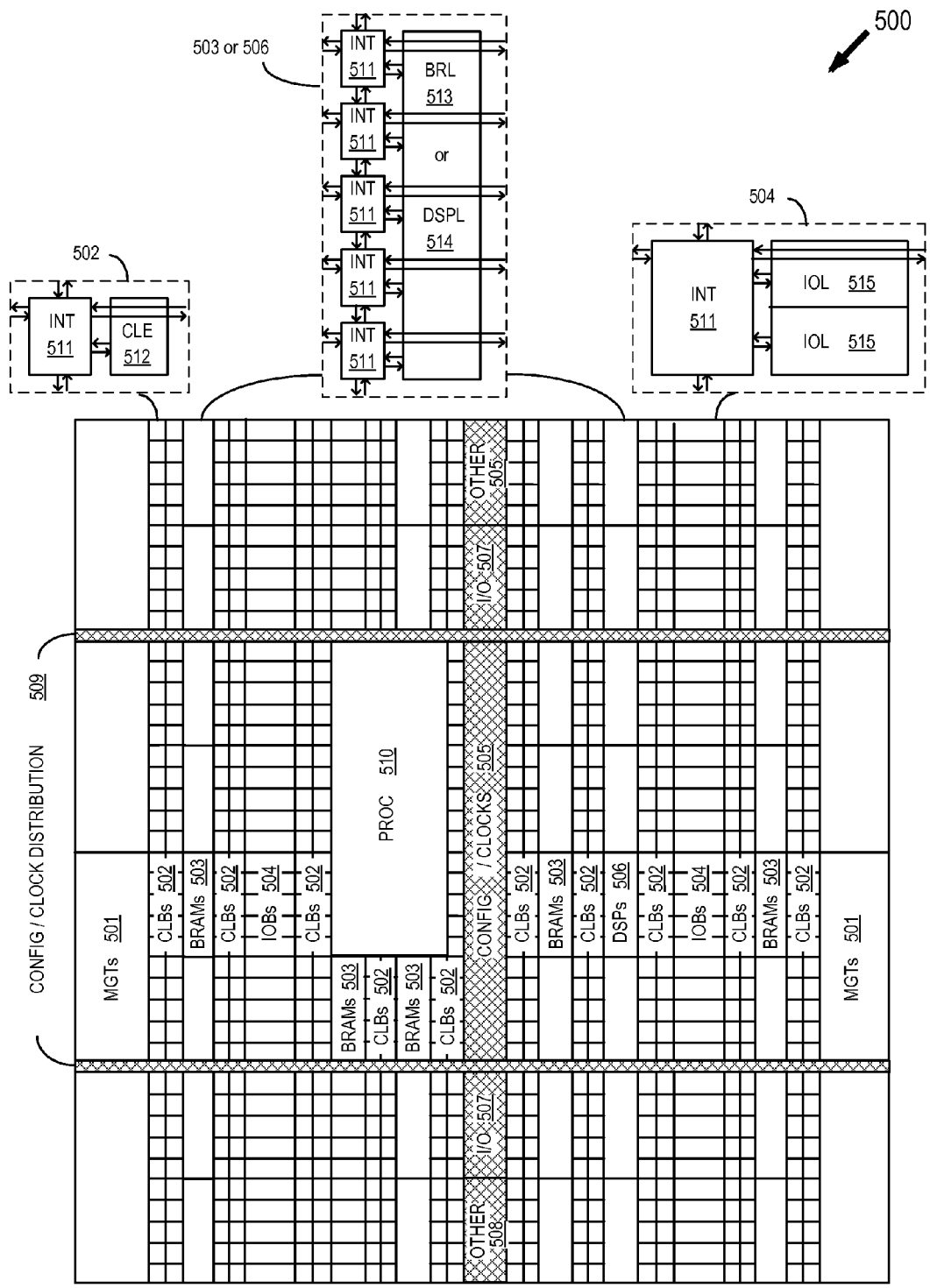
FIG. 5 illustrates an architecture of an example field programmable gate array (FPGA) that includes several different types of programmable logic blocks.

FIG. 5 illustrates an architecture of an example field programmable gate array (FPGA) that includes several different types of programmable logic blocks. Advanced FPGAs can include several different types of programmable logic blocks in the array. For example, FIG. 5 illustrates an FPGA architecture 500 that includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507) (e.g., configuration ports and clock ports), and other programmable logic 508 such as digital clock managers, analog-to-digital converters, system monitoring logic, and so forth. Some FPGAs also include dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element (INT 511) also includes the connections to and from the programmable logic element within the same tile, as shown by the examples included at the top of FIG. 5.

For example, a CLB 502 can include a configurable logic element (CLE 512) that can be programmed to implement user logic plus a single programmable interconnect element (INT 611). A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 506 can include a DSP logic element (DSPL 514) in addition to an appropriate number of programmable interconnect elements. An 10B 504 can include, for example, two instances of an input/output logic element (IOL 515) in addition to one instance of the programmable interconnect element (INT 511). As will be clear to those of skill in the art, the actual I/O pads connected, for example, to the I/O logic element 515 typically are not confined to the area of the input/output logic element 515.

In the pictured embodiment, a columnar area near the center of the die (shown shaded in FIG. 5) is used for configuration, clock, and other control logic. Horizontal areas 509 extending from this column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable storage media or delivery channels such as magnetic or optical disks or tapes, electronic storage devices, or as application services over a network.

The present invention is thought to be applicable to a variety of methods for determining clock skew between nodes of an integrated circuit. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A processor-implemented method of determining a clock skew between first and second nodes of a plurality of nodes of an integrated circuit, comprising:

generating and storing a set of respective first delay values for paths from a clock source through a clock tree of the integrated circuit to the plurality of nodes;

generating and storing a set of respective second delay values for the paths from the clock source through the clock tree to the plurality of nodes, wherein each of the first delay values corresponds to one of the second delay values for a given one of the plurality of nodes, and each of the first delay values is greater than the corresponding one of the second delay values;

generating and storing a set of common delay values, each of the common delay values being a delay for a shared portion of the paths from the clock source through the clock tree to two of the plurality of nodes;

determining the clock skew based on the first delay value for the first node, the second delay value for the second node, and the common delay value for the shared portion of the paths from the clock source through the clock tree to the first and second nodes; and outputting data indicative of the clock skew, wherein the determining and the outputting are performed by a processor.

2. The processor-implemented method of claim 1, wherein:

the first node is a source register and the second node is a destination register; and the clock skew is determined by subtracting the second delay value for the destination register and the common delay value for the shared portion of the paths from the clock source through the clock tree to the source and destination registers from the first delay value for the source register.

3. The processor-implemented method of claim 1, wherein:

the first delay values are maximum delay times for a clock signal to propagate from the clock source through the clock tree to each of the plurality of nodes; and the second delay values are minimum delay times for the clock signal to propagate from the clock source through the clock tree to each of the plurality of nodes.

4. The processor-implemented method of claim 1, wherein each of the common delay values is a difference between a maximum delay time for a clock signal to propagate from the clock source through the clock tree to a respective one of a plurality of common points and a minimum delay time for the clock signal to propagate from the clock source through the clock tree to the respective one of the plurality of common points.

5. A processor-implemented method of determining a clock skew between a source register and a destination register in a plurality of registers of the integrated circuit, comprising:

generating and storing a set of first delay values for paths from a clock source through a clock tree of the integrated circuit to each of the plurality of registers;

generating and storing a set of second delay values for the paths from the clock source through the clock tree to each of the plurality of registers, wherein each of the first delay values corresponds to one of the second delay values for a given one of the plurality of registers, and each of the first delay values is longer than the corresponding one of the second delay values;

generating and storing a set of common delay values, each of the common delay values being a delay for a shared portion of the paths from the clock source through the clock tree to two of the plurality of registers;

determining by a processor an estimate of the clock skew as a difference between the first delay value for the source register and the second delay value for the destination register;

determining by the processor the clock skew as a difference between the estimate and the common delay value for the shared portion of the paths from the clock source through the clock tree to the source and destination registers; and outputting by the processor data indicative of the clock skew.

6. The processor-implemented method of claim 5, wherein each of the common delay values is a delay time from the clock source through the clock tree to a last common buffer on the paths to two of the plurality of registers.

7. The processor-implemented method of claim 6, wherein:

each of the plurality of registers is identified by a register key that identifies one of the first delay values and one of the second delay values; and each of the last common buffers on the paths to the registers is identified by a common buffer key that identifies one of the common delay values, wherein:

the register keys of the source and destination registers are used to identify a plurality of buffers on the paths from the clock source through the clock tree to the source and destination registers, and the common buffer key is determined from the plurality of buffers.

8. The processor-implemented method of claim 6, wherein the clock tree is divided into a plurality of clock regions that are each fed from the clock source, each clock region including a plurality of buffers that are arranged in a sequential order from the clock source, and, in response to the source and destination registers being in a same one of the clock regions, the last common buffer on the shared portion of the paths to the source and destination registers is the buffer that is lowest in the sequential order.

9. The processor-implemented method of claim 5, wherein each of the plurality of registers is identified by a register key and each of the shared portions of the paths is identified by a common buffer key, the register key of the source register being used to identify one of the first delay values, the register key of the destination register being used to identify one of the second delay values, and the common buffer key for the shared portion of the paths from the clock source through the clock tree to the source and destination registers being used to identify one of the common delay values.

10. The processor-implemented method of claim 9, wherein:

the estimate of the clock skew is determined by subtracting the second delay value for the destination register from the first delay value for the source register; and the clock skew between the source register and the destination register is determined by subtracting the common delay value for the shared portion of the paths from the clock source through the clock tree to the source and destination registers from the estimate of the clock skew.

11. The processor-implemented method of claim 5, wherein each of the common delay values is a difference between a maximum delay time for a clock signal to propagate from the clock source through the clock tree to a respective one of a plurality of common points and a minimum delay time for the clock signal to propagate from the clock source through the clock tree to the respective one of the plurality of common points.

12. The processor-implemented method of claim 5, wherein:
the first delay values are maximum delay times for a clock signal to propagate from the clock source through the clock tree to each of the plurality of registers; and
the second delay values are minimum delay times for the clock signal to propagate from the clock source through the clock tree to each of the plurality of registers.

13. The processor-implemented method of claim 5, wherein a common buffer algorithm is used to determine a last common buffer on the shared portion of the paths to the source and destination registers.

14. The processor-implemented method of claim 5, wherein the integrated circuit is a programmable logic device that includes an array of a plurality of programmable logic devices and a plurality of programmable interconnect devices.

15. A program storage medium, comprising:
a non-transitory processor-readable device configured with instructions for determining clock skew, wherein execution of the instructions by one or more processors causes the one or more processors to perform operations including:
generating and storing a set of respective first delay values for paths from a clock source through a clock tree of the integrated circuit to the plurality of nodes;
generating and storing a set of respective second delay values for the paths from the clock source through the clock tree to the plurality of nodes, wherein each of the first delay values corresponds to one of the second delay values for a given one of the plurality of nodes, and each of the first delay values is greater than the corresponding one of the second delay values;
generating and storing a set of common delay values, each of the common delay values being a delay for a shared portion of the paths from the clock source through the clock tree to two of the plurality of nodes; and
outputting data indicative of the clock skew based on the first delay value for the first node, the second delay value for the second node, and the common delay value for the shared portion of the paths from the clock source through the clock tree to the first and second nodes.

16. The program storage medium of claim 15, wherein:
the first node is a source register and the second node is a destination register; and
the clock skew is determined by subtracting the second delay value for the destination register and the common delay value for the shared portion of the paths from the clock source through the clock tree to the source and destination registers from the first delay value for the source register.

17. The program storage medium method of claim 15, wherein:
the first delay values are maximum delay times for a clock signal to propagate from the clock source through the clock tree to each of the plurality of nodes; and
the second delay values are minimum delay times for the clock signal to propagate from the clock source through the clock tree to each of the plurality of nodes.

18. The program storage medium of claim 15, wherein each of the common delay values is a difference between a maximum delay time for a clock signal to propagate from the clock source through the clock tree to a respective one of a plurality of common points and a minimum delay time for the clock signal to propagate from the clock source through the clock tree to the respective one of the plurality of common points.

19. The program storage medium of claim 15, wherein the integrated circuit is a programmable logic device that includes an array of a plurality of programmable logic blocks and a plurality of programmable interconnect elements.

20. The program storage medium of claim 15, wherein each of the common delay values is a delay time from the clock source through the clock tree to a last common buffer on the paths to two of the plurality of nodes.

* * * * *